United States Patent
Castellano et al.

(10) Patent No.: US 11,587,378 B2
(45) Date of Patent: Feb. 21, 2023

(54) ELECTRONIC DEVICE FOR EFFICIENTLY SAVING HISTORIC DATA OF AMBIENT SENSORS AND ASSOCIATED METHOD

(71) Applicant: STMICROELECTRONICS S.r.l., Agrate Brianza (IT)

(72) Inventors: Marco Castellano, Pavia (IT); Marco Leo, Settimo Milanese (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 222 days.

(21) Appl. No.: 17/012,495

(22) Filed: Sep. 4, 2020

(65) Prior Publication Data
US 2021/0082212 A1    Mar. 18, 2021

(30) Foreign Application Priority Data
Sep. 12, 2019  (IT) .................... 102019000016136

(51) Int. Cl.
*G07C 5/08*  (2006.01)
*G06N 20/00* (2019.01)
*B60W 50/06* (2006.01)
*H03M 7/30* (2006.01)

(52) U.S. Cl.
CPC ............ *G07C 5/085* (2013.01); *B60W 50/06* (2013.01); *G06N 20/00* (2019.01); *H03M 7/30* (2013.01)

(58) Field of Classification Search
CPC ....... G07C 5/085; B60W 50/06; G06N 20/00; H03M 7/30
See application file for complete search history.

(56) References Cited

U.S. PATENT DOCUMENTS

| | | | |
|---|---|---|---|
| 10,162,551 B2 | 12/2018 | Leo et al. | |
| 2007/0233477 A1 | 10/2007 | Halowani et al. | |
| 2012/0265716 A1* | 10/2012 | Hunzinger | G06N 5/02 706/12 |
| 2017/0343577 A1 | 11/2017 | Lefebvre | |

FOREIGN PATENT DOCUMENTS

| | | |
|---|---|---|
| WO | 2013/093173 A1 | 6/2013 |
| WO | 2017/114578 A1 | 7/2017 |

OTHER PUBLICATIONS

"Freqz", MathWorks, obtained Sep. 29, 2020, https://www.mathworks.com/help/signal/ref/freqz.html, 9 pages.

* cited by examiner

*Primary Examiner* — Manuel A Rivera Vargas
(74) *Attorney, Agent, or Firm* — Seed Intellectual Property Law Group LLP

(57) ABSTRACT

A device includes sensing circuitry, compression circuitry, and a memory. The sensing circuitry, in operation, generates sensor data. The compression circuitry is coupled to the sensing circuitry, and, in operation, determines environmental contexts based on variation rates of sensor data and compresses sensor data based on determined environmental contexts. The compressed data is stored in the memory.

22 Claims, 5 Drawing Sheets

```
if(Feat1<=Threshold0) {
        if(Feat4 <= Threshold1){
                result = 7;
                return;
        }
        else {
                if(Feat7 <=Threshold3){
                        result = 3; return
                }
                else {
                        result = 8; return;
                }
        }
}
else {
        if(Feat2 <=Threshold2){
                if(Feat5 <=Threshold4){
                        result = 4; return;
                }
                else {
                        result = 5; return;
                }
        }
        else {
                result = 8; return;
        }
}
```

FIG. 7

ELECTRONIC DEVICE FOR EFFICIENTLY SAVING HISTORIC DATA OF AMBIENT SENSORS AND ASSOCIATED METHOD

BACKGROUND

Technical Field

The present disclosure relates to an electronic device for efficiently saving historic data of ambient sensors and to the associated method.

Description of the Related Art

This disclosure, for example, regards a mobile or transportable electronic device having, or associated to, ambient sensors, such as inertial sensors, position (and derivatives thereof) sensors and the like, for example of a MEMS (Micro-Electro-Mechanical System) type, and having, or associated to, a memory element intended to save the data supplied by the sensors and possibly data obtained therefrom.

As is known, current mobile apparatus, such as mobile phones, tablets, palmtops, smartwatches, portable or wearable electronic apparatus, inertial-navigation apparatus, automotive systems, robot systems, etc., enable collection of a large amount of ambient data that are used in an ever-increasing number of applications and programs. In particular, such devices may comprise sensors for detecting physical quantities, such as inertial sensors, which detect acceleration and angular velocity data; position sensors, such as magnetometers and proximity sensors; sensors of derived signals, such as quaternions (data representing rotations and directions in three-dimensional space) and gravity signals; motion detectors, such as step counters, sensors used for running, uphill sensors, floor sensors, etc.; and signals for detecting environmental quantities, which detect quantities such as pressure, temperature, humidity, and lighting, and are used in the various applications.

In general, the data acquired by the sensors are saved to a suitable memory, which, at any moment, contains a "history" of the latest values of the saved data, the length whereof being linked to the available memory locations.

On the other hand, current applications that use the data mentioned above provide for acquiring and saving an ever-increasing number of data, also when the data detecting sensors are in resting conditions. In particular, new applications call both for an increase in the number of signals and acquired physical quantities (increase in data "type") and an increase in data "history", in terms of number of previously saved samples referring to a same acquired signal. Consequently, it is desired to have an increasingly greater memory capacity, a desire that is in contrast with the desire for containing or even reducing the size and costs of the mobile apparatus as a whole and therefore of the associated memory devices.

BRIEF SUMMARY

The acquired data have a different time variability according to the context where the corresponding sensors operate; for example, a same signal supplied by an accelerometer or other sensor may have a high variability at certain moments and a very low variability at other moments. In this latter case, the samples of the latter signal (and the corresponding data to be stored) may be substantially constant or with little variability even for long periods. For instance, the position data are normally substantially constant when the mobile apparatus is in a fixed position, for example, it is lying on a surface, even though saving thereof requires the same space as that required for saving rapidly varying data, for example during a running session.

In fact, current apparatus, and the corresponding memories, whether embedded or not, do not carry out any check on the data value, and the latter occupy the same number of memory locations, even if their value remains, at least in part, the same or very similar.

Italian patent 102015000046888 (corresponding to the U.S. Pat. No. 10,162,551) discloses a saving apparatus and method wherein, when a redundancy in the acquired data is detected, data compression is carried out; a tag is associated to the compressed data, and the compressed data are saved in a memory. In particular, in this solution, a check is made on whether the acquired data contain particular conditions of high repetition (for example, whether, at least in some operating conditions, there exists a certain degree of repetitivity or limited variability as compared to the data previously acquired or to standard data saved), the repetitive data are compressed, and the data having low repetitivity are stored in non-compressed form.

The above solution enables a good saving of space, but the present applicant has realized it is susceptible of improvement.

In an embodiment, the present electronic device and the present data saving method facilitate increasing the compression level, taking into account the context in which the device is used. To this end, the device evaluates and classifies the type of activity associated to the acquired data. In fact, each type of activity may be associated to a compression model that is more efficient than others for the activity.

Therefore, according to one embodiment, the device processes the acquired data via an algorithm obtained, for example, by machine learning to determine the operating context of the device. For instance, the following contexts may be contemplated:

stationary device, referred to as "Still on table";
device carried by a user who is stationary, referred to as "Still on person";
device carried by a user who is walking, referred to as "Walking";
device carried by a user who is riding a bike, referred to as "Bike"; and
device carried by a user who is travelling in a motor vehicle, referred to as "Car".

The data acquired by the sensor(s) are compressed using a compression scheme correlated to the determined context and are associated to information on the type of performed compression, and the thus processed data are saved to memory.

According to a further possibility, prior to compression, the acquired data may be filtered, using various filters, also depending upon the context.

In an embodiment, an electronic device comprises: data acquisition circuitry configured to receive sensor data; context evaluation circuitry configured to determine an environmental context out of a plurality of environmental contexts based on a variation rate of the sensor data; and data compression circuitry configured to apply compression to the received sensor data based on the determined environmental context. In an embodiment, the context evaluation circuitry is configured to extract data features of a statistical and/or geometrical type, compare extracted data features with feature thresholds, generate context information based on outcomes of the comparisons, and determine the environmental context based on the context information. In an embodiment, the data features and the feature thresholds are determined by a machine learning tool. In an embodiment, the data features include mean, variance, energy, zero crossing and peak value. In an embodiment, the plurality of environmental contexts include a stationary device context, a device carried by a stationary user context, a device carried by a walking user context, a device carried by a bike riding user context, and a device in motion on a motor vehicle context.

In an embodiment, the compression is based upon delta and/or delta-square coding. In an embodiment, the compression is based on the following compression function f(x(i)):

$$f(x(i))=a \cdot x(i)+b \cdot x(i-1)+c \cdot x(i-2)+d \cdot x(i-3)+e \cdot x(i-4),$$

where f(x(i)) is a compressed datum, a, b, c, d, and e are parameters depending upon the determined environmental context, and x(i−j), with j=1 . . . 4, is a previous datum acquired in a j-th previous iteration. In an embodiment, the data compression circuitry verifies whether the compressed datum (f(x(i))) and at least one previous compressed datum (f(x(i−j))) are lower than one or more thresholds and sends the compressed datum to the memory element, together with the context information.

In an embodiment, the electronic device comprises a context dependent filter coupled to the data acquisition circuitry and to the context evaluation circuitry, the context dependent filter being configured to filter the data supplied by the data acquisition circuit based on the determined environmental context and generate filtered data supplied to the data compression circuitry. In an embodiment, the context dependent filter is a band-pass filter. In an embodiment, the electronic device comprises a data compressibility verification circuit, coupled to the context dependent filter and configured to compare the filtered data with a data filtering threshold and supply the filtered data to the data compression circuitry when the filtered data are lower than the data-filtering threshold.

In an embodiment, the electronic device comprises stored data acquisition circuitry; read context-identifying circuitry, coupled to the stored data acquisition circuitry; decompression and defiltering circuitry, coupled to the stored data acquisition circuitry and to the read context-identifying circuitry; and an output, coupled to the stored data acquisition circuitry and to the read context-identifying circuitry, wherein the stored data acquisition circuitry is configured to acquire read compressed data; the read context-identify circuitry is configured to search for a context tag in the stored data and send the acquired stored data and the context tag to the decompression and defiltering circuitry upon tag detection and send the stored data to the output, in absence of tag; and the decompression and defiltering circuitry is configured to decompress and inverse filter the stored data based on the context tag and to supply decompressed and inverse-filtered data to the output. In an embodiment, the electronic device comprises a sensor integrated in the electronic device, wherein the sensor is chosen among a physical quantity sensor, such as an inertial sensor detecting acceleration and/or angular velocity data; a position sensor, such as a magnetometer and a proximity sensor; a sensor of derived signals, such as quaternions and gravity signals; a motion detector, such as a step counter, a running sensor, an uphill sensor, a floor sensor; a sensor of environmental quantities, such as a pressure, temperature, humidity, and lighting sensor; an inertial sensor; a MEMS sensor; and combinations thereof. In an embodiment, the electronic device comprises a memory integrated in the electronic device.

In an embodiment, a system comprises: sensing circuitry, which, in operation, generates sensor data; and compression circuitry, coupled to the sensing circuitry, wherein the compression circuitry, in operation, determines environmental contexts based on variation rates of sensor data; and compresses sensor data based on determined environmental contexts. In an embodiment, the compression circuitry, in operation, extracts data features from sensor data, compares extracted data features with feature thresholds, generates context information based on the comparisons, and determines the environmental contexts based on the context information. In an embodiment, the system comprises a memory, wherein the compression circuitry, in operation, stores sensor data in the memory, the storing including storing compressed data and uncompressed data in the memory. In an embodiment, storing compressed data includes storing tags indicative of environmental contexts associated with the compressed data and the compression circuitry, in operation reads stored sensor data, the reading including detecting context tags. In an embodiment, the system comprises an application processor, which, in operation, implements one or more of a smartphone; a smartwatch; a PDA; a portable computer; a mobile phone; a tablet; a digital audio player; a photo or video camera, a palmtop, a portable or wearable electronic apparatus; or an inertial navigation apparatus.

In an embodiment, a method comprises: acquiring sensor data; determining an environmental context of a plurality of environmental contexts based on a non-constant variation rate of the sensor data; compressing the sensor data based on the determined environmental context; and storing the compressed data in a memory. In an embodiment, determining the environmental context comprises extracting statistical and/or geometrical data features, comparing the extracted data features with feature thresholds and generating context information based on outcomes of the comparison between the extracted data features and the feature thresholds. In an embodiment, the method comprises: acquiring a plurality of configuration data in the plurality of environmental contexts; and determining features of the configuration data and feature thresholds based on the environmental context using a machine learning tool. In an embodiment, the method comprises: filtering the acquired sensor data using a filter selected from a plurality of context dependent filters, the filter being selected based on the context information; comparing the filtered data with one or more filtering thresholds; and compressing the filtered data based on the comparing of the filtered data to the one or more filtering thresholds.

BRIEF DESCRIPTION OF THE SEVERAL VIEWS OF THE DRAWINGS

For a better understanding of the present disclosure, an embodiment thereof is now described, purely by way of non-limiting example, with reference to the attached drawings, wherein:

FIG. 7 shows an example of pseudo-code forming a decision tree generated via the scheme of FIG. 6.

DETAILED DESCRIPTION

Figure 1:
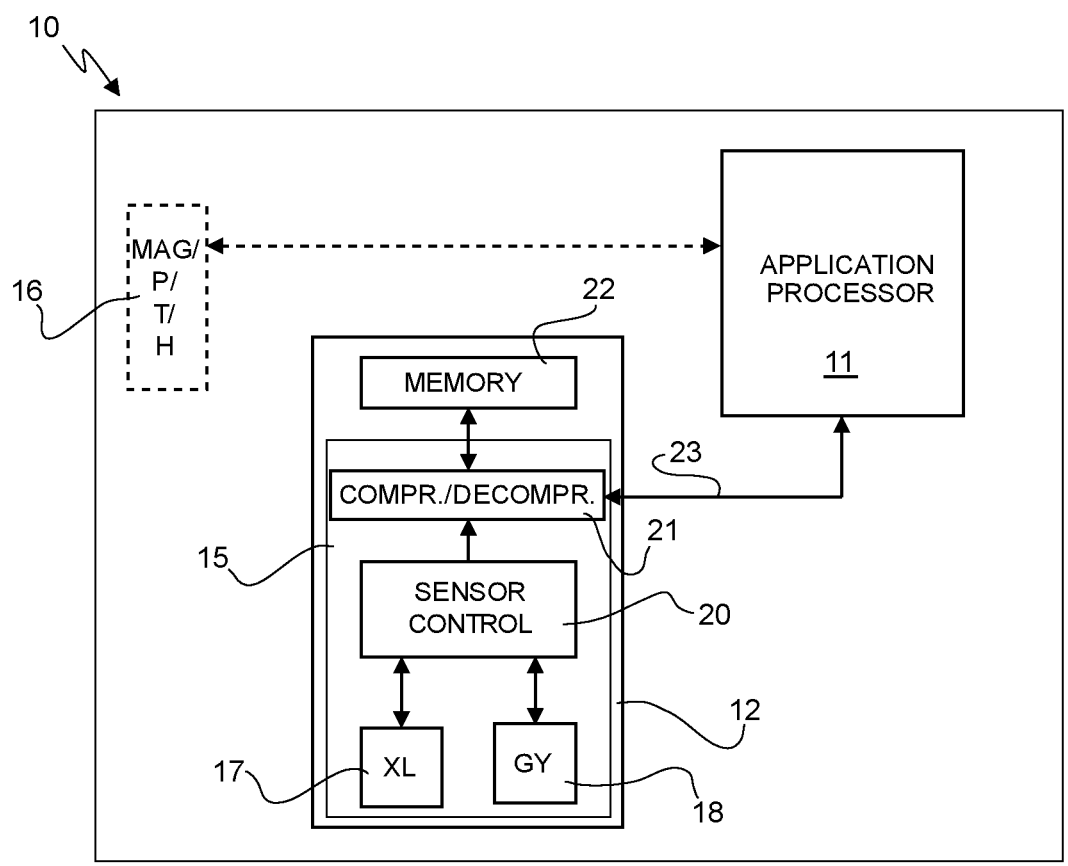
FIG. 1 shows a general block diagram of an electronic apparatus according to an embodiment.

FIG. 1 shows an electronic apparatus 10, typically a mobile device such as a mobile phone, a smartphone, a PDA (Personal Digital Assistant), a photographic or video camera, a wearable apparatus, such as a smartwatch or an electronic bracelet.

In the embodiment illustrated in FIG. 1, the apparatus 10 comprises an application processor 11, a sensor interface 12, and a plurality of sensors, including first sensors 16, a second sensor 17, and a third sensor 18.

In the electronic apparatus 10, the application processor 11 may implement an operating system of the apparatus 10 and may be formed by a controller or a microprocessor that sends commands to the sensor interface 12 and to the sensors 16-18 and receives therefrom, directly or indirectly, data regarding the signals acquired by the sensors. The application processor 11 is here directly connected to the sensor interface 12 and to the first sensors 16.

The first sensors 16 are here magnetic and ambient sensors, of a stand-alone type, and may comprise one or more of the following sensors: a magnetometer, supplying a magnetic-field signal MAG[x,y,x]; a pressure sensor, supplying a pressure signal P; a temperature sensor, supplying a temperature signal T; and a humidity sensor, supplying a humidity signal H. The first sensors 16 are here directly coupled to the application processor 11.

The second sensor 17 is, for example, a triaxial accelerometer, supplying an accelerometric signal XL[x,y,z] indicating the accelerations acting in the electronic apparatus 10 along the three axes X,Y,Z of an inertial reference system.

The third sensor 18 is, for example, a gyroscope, also triaxial, supplying a gyroscopic signal GY[x,y,z] indicating the angular velocities acting about the three axes X,Y,Z.

In the embodiment of FIG. 1, the second and third sensors 17, 18 are formed within the sensor interface 12 and within a sensor device 15, which may be packaged and may also comprise a control circuit or unit 20 and a compression/decompression unit 21.

In the illustrated embodiment, the sensor interface 12 also comprises a data memory 22, coupled to the sensor device 15, but external, for example carried by a same board. Other solutions are, however, possible, with all the sensors 16, 17, 18 separate and external to the sensor device 15, on the same board or on a different board. Alternatively, all the sensors 16, 17, 18 may be internal to and packaged in the sensor device 15. The data memory 22 may be external or internal to the sensor device 15; in this latter case, it may be packaged with at least some of the components 16, 17, 18, 20, and 21.

The sensor interface 12 has the task of acquiring ambient signals from the second and third sensors 17, 18 (hereinafter also defined as internal sensors 17, 18) through the control unit 20; performing a pre-processing of the acquired signals via a compression/decompression circuit or unit 21 for generating pre-processed data; saving the pre-processed data to the data memory 22; and supplying the saved data to the application processor 11.

In particular, the signals generated by the internal sensors 17, 18 and supplied to the control unit 20 may already be in digital format, associated to samples of the signals acquired in successive times (or iterations) or to data processed from these signals.

In particular, the control unit 20 here has the task of driving and controlling operation of the internal sensors 17, 18, as well as acquiring data supplied by these sensors. The control unit 20 may, for example, be an ASIC (Application-Specific Integrated Circuit) and comprise a buffer (not shown) for temporary storage of the acquired data.

The compression/decompression unit 21 has the task of processing the data supplied by the control unit 20 to verify whether and to what extent they are compressible, taking into account the context, prior to storage thereof to the data memory 22. In particular, the compression/decompression unit 21 may use a function of the following type:

$$f(x(i)) = a \cdot x(i) + b \cdot x(i-1) + c \cdot x(i-2) + d \cdot x(i-3) + e \cdot x(i-4),$$

where a, b, c, d, e are parameters, for example integers, positive, negative, or zero, depending upon the context, as discussed below, and x(i−j), with j=1, . . . , 4, is a datum acquired in a j-th previous iteration.

Moreover, the compression/decompression unit 21 has the task of reading the data stored in the data memory 22 and, in case, decompressing them, prior to supplying them to the application processor 11, for example via a bus 23. For instance, the compression/decompression unit 21 may comprise a microcontroller (μC), a microprocessor, a DSP (Digital Signal Processor), an FPGA (Field-Gate Programmable Array), an ASIC, or similar calculation circuit or unit.

The data memory 22, generally of a volatile type, such as a RAM, stores the data acquired, for example, by the internal sensors 17, 18. For instance, the data memory 22 may be of a FIFO (First In/First Out) type, LIFO (Last In/First Out) type, or comprise registers of some other type.

In a known manner and not described in detail, the data to be stored to the data memory 22 may be associated to a byte specifying the datum type (datum acquired by an accelerometer, a gyroscope, or some other sensor, or derived datum); the time slot or temporal priority of the datum acquired by the sensor; and a parity bit for datum integrity check. Moreover, as explained more fully hereinafter, the data to be stored in the data memory 22, when they are compressed, may be associated to a tag specifying the associated context.

With the sensor device 15 described herein, compression may be carried out taking into account the spectral content of the data so as to maximise the information content and the compression rate according to the context.

In fact, studies conducted by the present applicant have shown that, during some types of activity performed by a person carrying the electronic apparatus 10, some compression schemes are more effective than others. Moreover, it has been found that the context may be detected without carrying out long and complex (and therefore costly) frequency analyses, but in the time domain, using machine learning techniques, and therefore within the electronic apparatus 10, and within the sensor device 15. In particular, compression algorithms of a delta and delta-square type, where, starting from a datum having a reference value, the subsequent data are saved as difference from the previous value, have proven particularly effective. With this technique, datum that presents, with respect to the previous datum, a variation, or delta, having a value lower than a given threshold can be compressed, just saving the variation value. In this way, the number of bits to be saved is reduced. Moreover, if the delta in turn presents, with respect to the previous delta, a variation or delta square, lower than a given threshold, this further variation can be saved, further reducing the number of bits used for storage.

Figure 2:
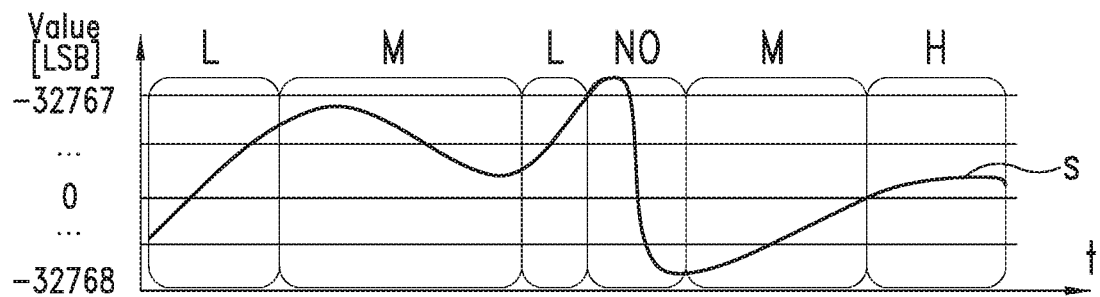
FIG. 2 shows an example of data variability and possible compression levels.

FIG. 2 shows an example of signal (designated by S) detected by an inertial sensor (for example, an accelerometer or other sensor of the type referred to above), which has different variability ranges and therefore may be stored efficiently using a delta or delta-square technique. In FIG. 2, it has been assumed that the signal S can be digitalised, over its possible total value, on 64 kbits; moreover, the figure shows four different variability ranges of the signal S, associated to possible different compression levels, namely:

NO indicates a range where compression is not possible without loss of information;

L indicates a range where a low compression is possible without loss of information;

M indicates a range where a medium compression is possible without loss of information; and H indicates a range where a high compression is possible without loss of information.

Studies conducted by the present applicant have moreover highlighted that the signal variability detected by the inertial sensors can be identified and classified, considering, for example, five contexts: apparatus stationary on the table; apparatus carried by a stationary person; apparatus carried by a walking person; apparatus carried by a riding person; and apparatus carried by a person who is travelling in a motor vehicle (e.g., car).

Figure 3:
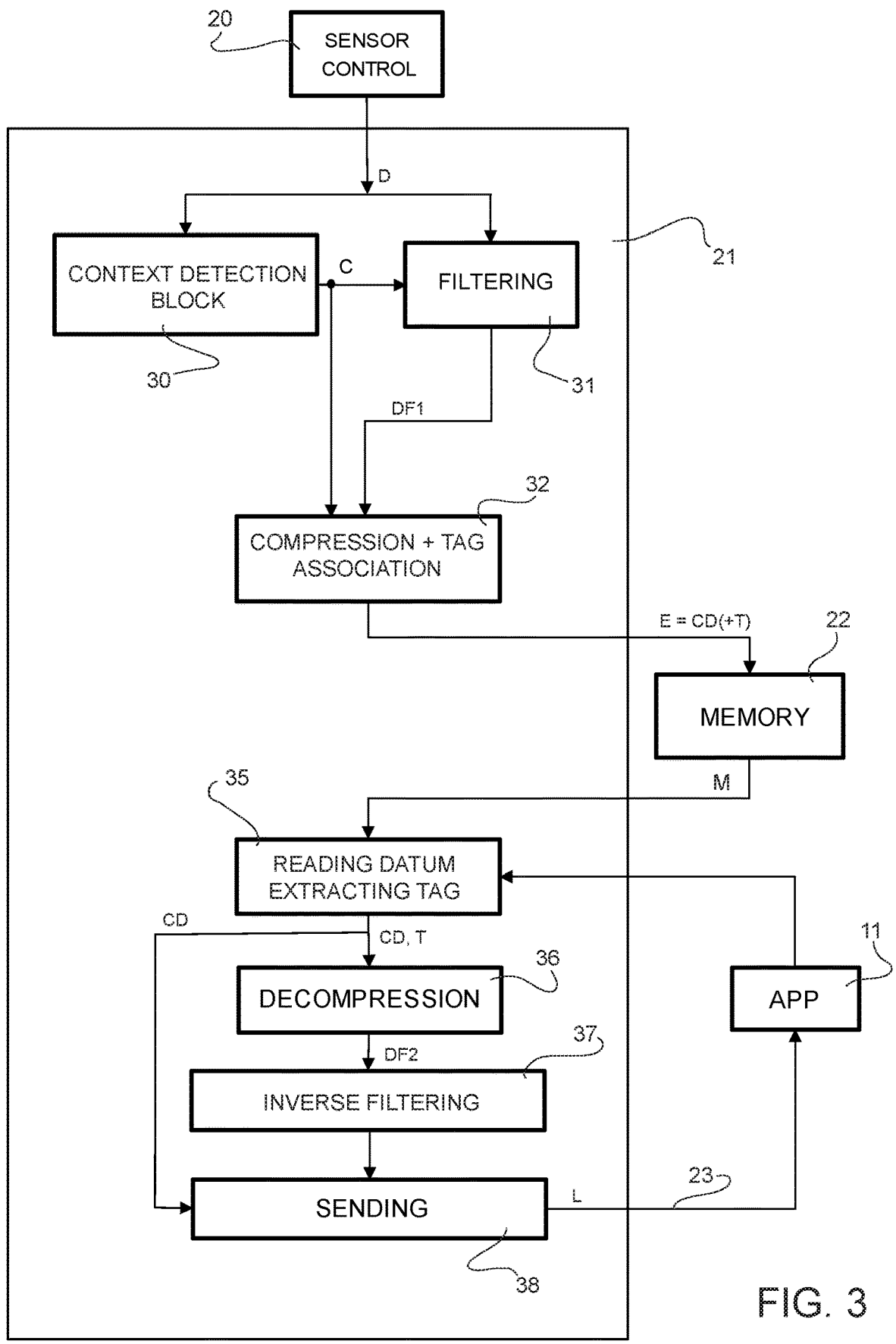
FIG. 3 is a functional block diagram of an embodiment of an electronic device forming part of the apparatus of FIG. 1, for performing a context-based compression and decompression function.

Using this context classification, the compression/decompression unit 21 can be represented functionally as illustrated in FIG. 3 and comprises:

a context-detection block 30, which receives the data D, digitalised and possibly pre-processed, from the control unit 20 and determines the context thereof (context signal C);

a filtering block 31, which carries out filtering of the digitalised data D on the basis of the context signal C, to generate filtered data DF1; and a compression and tag-association block 32, which compresses the filtered data DF1 supplied by the filtering block 31, if this is possible; the compression and tag-association block 32, which may comprise data buffers for temporary storage of the data during processing thereof, receives the context signal C from the context-detection block 30 and compresses the filtered data DF1 according to the context, using a compression function that depends upon the context (for example, as explained more fully hereinafter); in addition, the compression and tag-association block 32 associates the compressed data to a tag T indicating the type of filtering and compression carried out, to generate processed data E supplied to the data memory 22 for saving thereof.

The compression/decompression unit 21 as illustrated further comprises:

a reading block 35, which, when activated, for example, by the application processor 11, reads a datum M stored in the data memory 22 and obtains the tag T thereof;

a decompression block 36, which receives the stored datum M and the tag T and carries out decompression on the basis of the context, for example as explained in greater detail below, to generate a decompressed datum DF2;

an inverse-filtering block 37, which inversely filters the decompressed datum DF2, taking into account the context of the data, as specified by the tag T, to generate a read datum L; and an output block 38, which receives the read datum L from the inverse-filtering block 37 or the stored datum M from the reading block 35 (when the datum had not been compressed) and supplies it to the application processor 11 through the bus 23.

As mentioned above, filtering and compression of the data may be carried out taking into account the spectral energy content and depend upon the context.

Figure 4:
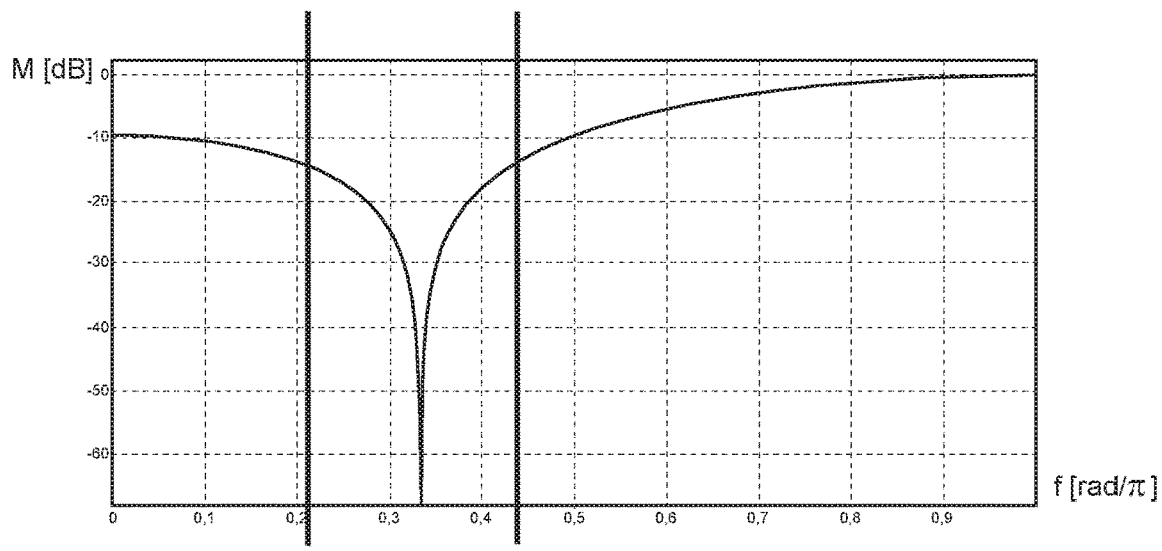
FIGS. 4 and 5 show data filtering ranges of two different filters used in the electronic device of FIG. 3, according to the context.

For instance, FIG. 4 shows the plot of the spectral energy content M of the digitalised data D and the corresponding filter applied to the context "Walking" as a function of the normalised frequency. In this context, the information content is comprised in the frequency range 2-4 Hz. Consequently, the data supplied by the internal sensors 17, 18 of FIG. 1 can be filtered so as to suppress the signal components falling outside this range. For instance, in this case, the digitalised data D can be filtered by a filter F1 of a freqz type having the following transfer function H1:

$$H1=\text{freqz}([-1,1,-1],3)$$

(see, for example, discussions of freqz filters by Mathworks™).

In the example considered of the context "Walking", the filtered datum DF1 is then processed by the compression and tag-association block 32 in order to verify the possibility of compression. In particular, the compression and tag-association block 32 calculates the following compression function:

$$f1(x(i))=-x(i)+x(i-1)+x(i-2) \quad (1)$$

where x(i) is the present sample of the filtered datum DF1, x(i−1) is the sample prior to the present one, and x(i−2) is the sample prior to x(i−1).

Moreover, the compression and tag-association block 32 also calculates (or acquires the result of a previous processing) the function f1(x(i−1))

$$f1(x(i-1))=-x(i-1)+x(i-2)+x(i-3) \quad (2)$$

The compression block 32 then verifies whether the following condition is satisfied:

$$F1(x(i))<\text{THS AND } f1(x(i-1))<\text{THS} \quad (3)$$

where THS is a threshold, which may be determined by the machine learning algorithm, as discussed hereinafter.

If the condition (3) is verified, the compressed datum CD1=[f1(x(i))] is sent to the data memory 22, after being associated to the tag T that specifies the context as being "Walking", together with possible further information, for example for parity check or information useful for decompression. The compressed datum CD1=[f1(x(i))] may moreover be locally stored in the compression and tag-association block 32 to enable verification of condition (3) for the following sample.

The compressed datum CD1 can then be reconstructed (decompressed) using the following function:

$$x(i)=-[f1(x(i))+f1(x(i-1))]-x(i-3) \quad (4)$$

which is obtained by combining Eq. (1) with Eq. (2).

Therefore, in this case, the decompression block 36, on the basis of the tag T read by the tag-reading block 35, reconstructs the filtered datum DF1 on the basis of Eq. (4).

As an alternative to the above, compression of the data may be even more marked. For instance, when condition (3) is satisfied, Eqs. (1) and (2) can be further applied on the results, by calculating, for example, f1(f1(x(i))) and f1(f1(x(i−1))) and verifying whether the result is lower than the threshold THS (or some other threshold determined by the machine learning algorithm). In this case, the double-compressed datum f1(f1(x(i))) is sent to the data memory 22 as compressed datum CD1, and the tag T may have a value that encodes this further compression.

Figure 5:
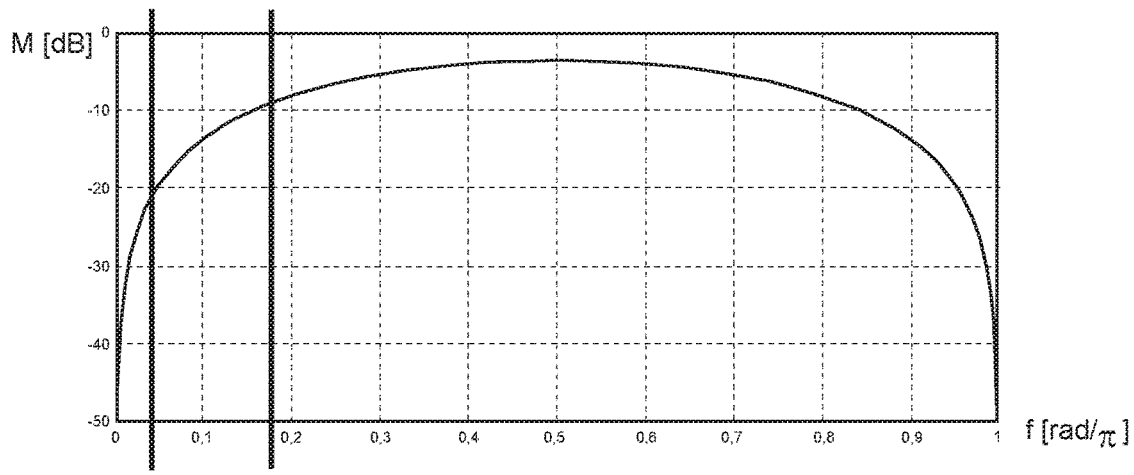

In the case of context "Bike" or "Car", the spectral energy content is comprised in the range 1-2 Hz, as illustrated in FIG. 5. In this case, it is possible to use a band-pass suppression filter, which suppresses the signal components at frequencies falling outside this range.

In this case, the digitalised data D can be filtered by a filter F2 having a transfer function H2:

$$H2=\text{freqz}([1,0,-1],3)$$

to obtain the filtered datum DF1.

Analogously to the above, the filtered datum DF1 is then processed by the compression and tag-association block 32 to verify the possibility of compression. In particular, the compression and tag-association block 32 calculates the following function:

$$f2(x(i))=x(i)-x(i-2) \quad (5)$$

where x(i) and x(i−2) are the samples defined above (present sample and sample of two preceding readings).

Moreover, the compression and tag-association block 32 also calculates the functions f2(x(i−1)) and f2(x(i−2)) (or acquires the result of previous processing operations):

$$f2(x(i-1))=x(i-1)-x(i-3) \quad (6)$$

$$f2(x(i-2))=x(i-2)-x(i-4) \quad (7)$$

The compression block 32 then verifies whether the following condition is satisfied:

$$f2(x(i))<\text{THS AND } f2(x(i-2))<\text{THS} \quad (8)$$

In this case, analogously to the above, the compressed datum CD1=[f2(x(i))] is sent to the data memory 22, after being associated to the tag T specifying the context as being "Bike", as well as, in case, to further information. Moreover, the compressed datum CD1=[f2(x(i))] can be locally saved.

Here, by writing Eq. (7) as $$x(i-2)=f2(x(i-2))+x(i-4) \quad (9)$$

the sample DF1 can be reconstructed (decompressed) using Eq. (10), as follows:

$$x(i)=f2(x(i))+x(i-2)=f2(x(i))+f2(x(i-2))+x(i-4) \quad (10).$$

In case of the context "Still", for example, it is possible to perform just one threshold check on the samples, for example as described in Italian patent application 102015000046888 referred to above.

In practice, according to data collected by the present applicant and to simulations, it has been found that, in the context "Walking", data were compressed up to 1.4 times, in the context "Bike", data were compressed up to 2.6 times, and in the context "Car", data were compressed up to 1.8 times, without any loss of information in the reconstruction stage.

As mentioned above, in order to process the activity context of the sensors, an algorithm based upon a decision tree may be used, the rules and parameters whereof may be determined through a machine learning technique using databases collected, for example, during design of the sensor device 15 in known contexts and possibly while using the sensor device 15.

Figure 6:
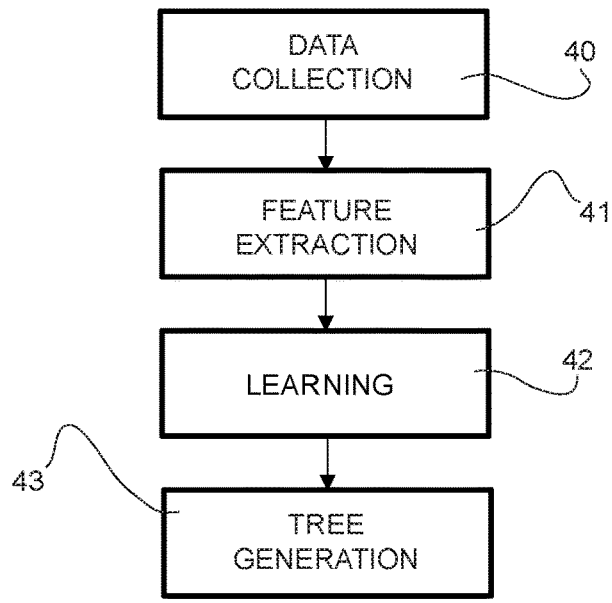
FIG. 6 shows an embodiment of a method of generating a decision tree used in the electronic device of FIG. 3.

To this end, a flowchart is followed, as shown in FIG. 6 and comprising:

data collection, step 40—data are collected for each type of activity (context) using sensors similar to the internal sensors 17, 18 of the sensor device 15, in known contexts and conditions;

data feature extrapolation, step 41—the features may be statistical or arithmetical parameters calculated from the data, such as mean, variance, energy, zero-crossing, and peak value; in particular, for each activity (context), the features are calculated in fixed time frames, and the tag identifying the context is associated; and machine learning, step 42—the data are processed through a training tool, for example using the WEKA (Waikato Environment for Knowledge Analysis) tool, developed by the University of Waikato, or other similar tool; it outputs a decision tree (block 43) used by the context-detection block 30.

In particular, the decision tree 43 is a sort of algorithm that yields a specific result when all the identified conditions and rules are satisfied.

For instance, the decision tree may have the structure shown in FIG. 7, where the variables (Feat1, Feat2, Feat5, Feat7) are the features used by the machine learning algorithm indicated above, and the thresholds (Threshold 1-4) depend upon the type of acquisition/recognition carried out by the algorithm and are extrapolated by the machine learning algorithm on the basis of the data used for learning. In FIG. 7, they are referred to as "result" and identified by a number (2, 3, 4, 5, 7, 8).

For instance, for the contexts "Walking" and "Bike", according to the features and the time frame, the values of the features may be of the order of a few tens of mg or g.

The decision tree 43 is here loaded into the sensor device 30 and namely into the context-detection block 30 so that, in use, on the basis of the data collected by the inertial sensors 17, 18, the context-detection block 30 determines the context, for example, periodically.

Figure 8:
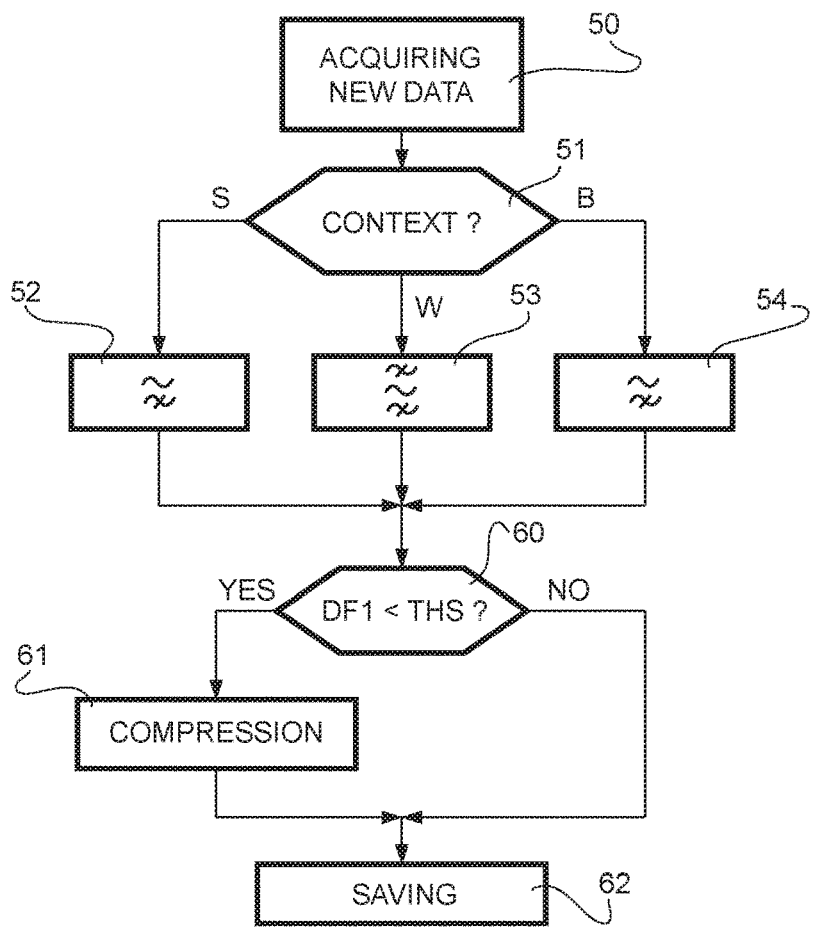
FIGS. 8 and 9 are flowcharts of embodiments of data saving and reading processes carried out by the electronic device of FIG. 3.

On the basis of the foregoing, the sensor device 15 operates, during data acquisition, according to the flowchart represented in FIG. 8 and described below, also with reference to the block diagram of FIG. 3.

In particular, periodically, after acquiring a new packet containing a determined number of samples, or upon detecting a critical operating condition, for example filling a temporary buffer of the control unit 20 of FIG. 3, the context-detection block 30 is activated to determine the context, step 50. To this end, as mentioned, it uses the decision tree 43 of FIG. 7.

In the considered case, three contexts are considered: apparatus 10 stationary on the table or on a person (still context—S); apparatus 10 carried by a walking user (walking context—W); and apparatus 10 carried by a user riding a bike or travelling in a motor vehicle (bike context—B), step 51. In context S, high-pass filtering is carried out, step 52; in context W, band-pass filtering is carried out, as discussed with reference to FIG. 4, step 53; finally, in context B, low-pass filtering is carried out, as discussed with reference to FIG. 5, step 54.

Then, the compression and tag-association block 32 (FIG. 3) verifies whether the filtered data DF1 are lower than the threshold, step 60, and, if so, compresses the filtered data DF1, for example via a delta or delta-square modulation, as explained above, step 61.

At the end of compression or if the data are not compressible (output N from step 61), the data are saved to the memory 22 (FIG. 3), step 62. In particular, compressed data are saved in filtered and compressed form (compressed data CD), together with the corresponding tag T specifying the context and the performed compression; non-compressed data are saved in non-filtered form (read data D), without any tag T, in case associated to parity information.

Figure 9:
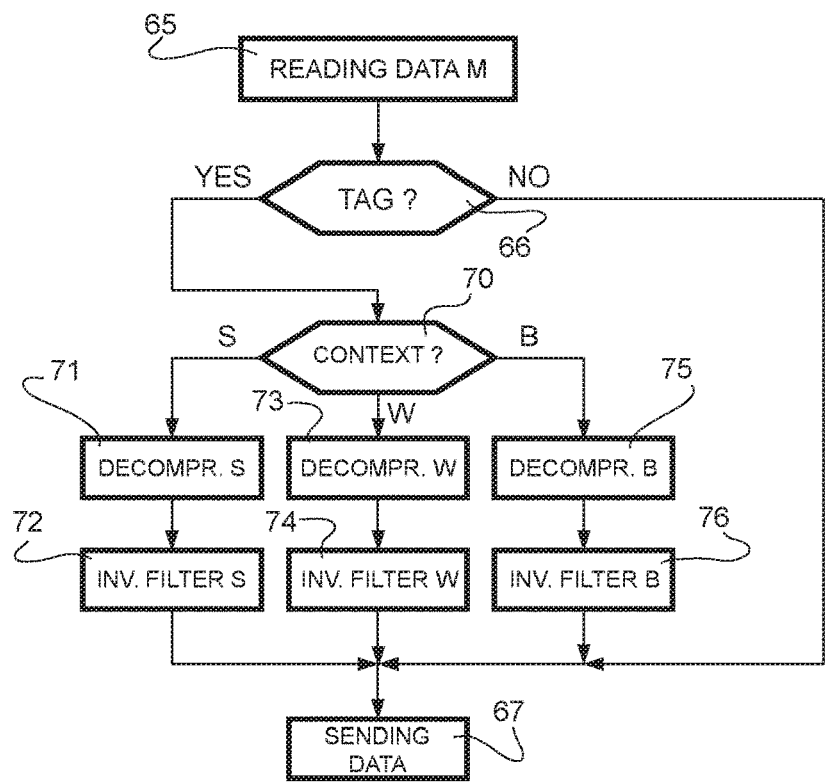

When the apparatus 10, through the application processor 11 (FIG. 1) calls for the stored data, data fetching from memory 22 is activated, as shown in FIG. 9 and described hereafter, with reference also to the block diagram of FIG. 3.

In detail, upon activation of data fetching from memory 22, the reading block 35 (FIG. 3) retrieves the stored data M from the memory 22, step 65, and checks whether a tag T is present, step 66. If no tag is present, read data are directly sent to the application processor 11, step 67.

If the reading block 35 detects a tag T, output Y from step 66, it decodes it to determine the context S, W or B regarding the just read data, step 70. In case of context S, the decompression block 36 carries out decompression of the read data, step 71, and the inverse-filtering block 37 filters the read datum with a filter inverse to the one used in the filtering step 52 of FIG. 6, step 72. In case of context W, the decompression block 36 carries out decompression of the read data, for example applying Eq. (4), step 73, and the inverse-filtering block 37 filters the read datum with a filter inverse to the one used in filtering step 53 of FIG. 6, step 72. Finally, in case of context B, the decompression block 36 carries out decompression of the read data, for example applying Eq. (10), step 75, and the inverse-filtering block 37 filters the read datum with a filter inverse to the one used in filtering step 54 of FIG. 6, step 76.

The decompressed output data of steps 72, 74, and 76 are sent to the application processor 11, step 67.

The sensor device, the electronic apparatus, and the data saving method described herein may provide many advantages.

In particular, due to the compression of the acquired data, the device may be able to save a large amount of data, larger than achievable by known devices. Since compression (and possible previous filtering) is carried out on the basis of the variability of the data, determined according to the context, e.g., to the degree of movement of the electronic device, verified also on the basis of thresholds, the compression can be carried out in a selective way adapted to the specific data, therefore with a high degree of efficiency and without any risk of loss of information.

Determination of the type of activity or context may be made using an algorithm preloaded into the device and therefore does not require costly or slow computing means, such as algorithms based upon spectral analysis in the frequency domain, such as FFT algorithms. The device therefore has a consumption level comparable to known devices that do not compress data or compress them via simple delta compressions that are the same for all data and/or all contexts.

The reduction in the amount of data to be periodically saved, the simplicity of the performed calculation operations, and the possible activation of compression procedures only in conditions of critical filling of the buffers enable limitation of consumption of the device as well as of the data bus, also in presence of a large amount of data in memory.

Finally, it is clear that modifications and variations may be made to the data saving device and to the associated method, described and illustrated herein, without departing from the scope of the present disclosure. For instance, the various solutions described may be combined so as to provide further embodiments.

Moreover, even though the foregoing description refers in particular to a device designed to be inserted in a mobile electronic apparatus, worn by a user in everyday life, having inertial sensors and designed to cooperate with an application processor performing applications stored in the electronic apparatus, the same solution can be applied to electronic apparatus that are usually not wearable, but are mobile in certain situations so that the corresponding sensors acquire data having a non-constant variability rate that depends upon the context (for example, zero in some contexts, for instance in the case where they are stationary or in laboratory contexts, and variable in other contexts), for which it is desired to be able to increase the saving using an efficient compression, variable according to the context.

In addition, as mentioned, the sensors may be internal or external to the device, as likewise the memory for storing the data subjected to selective compression operations.

The indicated thresholds THS for verifying any possibility of compression may be different, according to the context.

The filters H1 and H2 can also use frequency response functions for digital filters other than the indicated function freqz.

Some embodiments may take the form of or comprise computer program products. For example, according to one embodiment there is provided a computer readable medium comprising a computer program adapted to perform one or more of the methods of functions described herein. The medium may be a physical storage medium, such as for example a Read Only Memory (ROM) chip, or a disk such as a Versatile Disk (DVD-ROM), Compact Disk (CD-ROM), a hard disk, a memory, a network, or portable media article to be read by an appropriate drive or via an appropriate connection, including as encoded in one or more barcodes or other related codes stored on one or more such computer-readable mediums and being readable by an appropriate reader device.

In some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including micro controllers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
data acquisition circuitry configured to receive sensor data;

context evaluation circuitry configured to determine an environmental context out of a plurality of environmental contexts based on a variation rate of the received sensor data, the determining the environmental context including extracting data features, comparing extracted data features with feature thresholds, generating context information based on outcomes of the comparisons, and determining the environmental context based on the context information;

data compression circuitry coupled to the data acquisition circuitry and to the context evaluation circuitry, wherein the data compression circuitry is configured to apply compression to the received sensor data based on the determined environmental context; and a memory integrated in the electronic device and coupled to the data compression circuitry, wherein the data compression circuitry is configured to store compressed sensor data and uncompressed sensor data in the memory.

2. The electronic device according to claim 1, comprising a context dependent filter coupled to the data acquisition circuitry and to the context evaluation circuitry, the context dependent filter being configured to filter the data supplied by the data acquisition circuit based on the determined environmental context and generate filtered data supplied to the data compression circuitry.

3. The electronic device according to claim 2, wherein the context dependent filter is a band-pass filter.

4. The electronic device according to claim 2, comprising a data compressibility verification circuit, coupled to the context dependent filter and configured to compare the filtered data with a data filtering threshold and supply the filtered data to the data compression circuitry when the filtered data are lower than the data-filtering threshold.

5. The electronic device according to claim 1, wherein the compression is based on a compression function $f(x(i))$:

$$f(x(i))=a\cdot x(i)+b\cdot x(i-1)+c\cdot x(i-2)+d\cdot x(i-3)+e\cdot x(i-4),$$

where $f(x(i))$ is a compressed datum, a, b, c, d, and e are parameters depending upon the determined environmental context, and $x(i-j)$, with $j=1 \ldots 4$, is a previous datum acquired in a j-th previous iteration.

6. The electronic device according to claim 5, wherein the data compression circuitry verifies whether the compressed datum $(f(x(i)))$ and at least one previous compressed datum $(f(x(i-j)))$ are lower than one or more thresholds and sends the compressed datum to the memory element, together with the context information.

7. The electronic device according to claim 1, wherein the plurality of environmental contexts include a stationary device context, a device carried by a stationary user context, a device carried by a walking user context, a device carried by a bike riding user context, and a device in motion on a motor vehicle context.

8. The electronic device according to claim 1, wherein the compression is based upon delta coding, delta-square coding, or combinations thereof.

9. The electronic device according to claim 1, comprising:
stored data acquisition circuitry;
read context-identifying circuitry, coupled to the stored data acquisition circuitry;
decompression and defiltering circuitry, coupled to the stored data acquisition circuitry and to the read context-identifying circuitry; and
an output, coupled to the stored data acquisition circuitry and to the read context-identifying circuitry, wherein the stored data acquisition circuitry is configured to acquire read compressed data;
the read context-identify circuitry is configured to search for a context tag in the stored data and send the acquired stored data and the context tag to the decompression and defiltering circuitry upon tag detection and send the stored data to the output, in absence of tag; and
the decompression and defiltering circuitry is configured to decompress and inverse filter the stored data based on the context tag and to supply decompressed and inverse-filtered data to the output.

10. The electronic device according to claim 1, comprising at least one sensor integrated in the electronic device, wherein the at least one sensor is chosen among a group of sensors including a physical quantity sensor; a position sensor; a sensor of derived signals; a motion detector; a sensor of environmental quantities; a MEMS sensor; and combinations thereof.

11. An electronic device, comprising:
data acquisition circuitry configured to receive sensor data;
context evaluation circuitry configured to determine an environmental context out of a plurality of environmental contexts based on a variation rate of the sensor data; and
data compression circuitry configured to apply compression to the received sensor data based on the determined environmental context, wherein the context evaluation circuitry is configured to extract data features of a statistical and/or geometrical type, compare extracted data features with feature thresholds, generate context information based on outcomes of the comparisons, and determine the environmental context based on the context information.

12. The electronic device according to claim 11, wherein the data features and the feature thresholds are determined by a machine learning tool.

13. The electronic device of claim 11, wherein the data features include mean, variance, energy, zero crossing and peak value.

14. The electronic device according to claimer 11, comprising a memory integrated in the electronic device.

15. A system, comprising:
sensing circuitry, which, in operation, generates sensor data;
a memory; and
compression circuitry, coupled to the sensing circuitry and to the memory, wherein the compression circuitry, in operation,
determines environmental contexts based on variation rates of sensor data;
compresses sensor data based on determined environmental contexts; and
stores sensor data in the memory, the storing including storing compressed data and uncompressed data in the memory.

16. The system of claim 15, wherein the compression circuitry, in operation, extracts data features from sensor data, compares extracted data features with feature thresholds, generates context information based on the comparisons, and determines the environmental contexts based on the context information.

17. The system of claim 15, wherein storing compressed data includes storing tags indicative of environmental contexts associated with the compressed data and the compression circuitry, in operation reads stored sensor data, the reading including detecting context tags.

18. A method, comprising:
acquiring sensor data;
determining an environmental context of a plurality of environmental contexts based on a non-constant variation rate of the sensor data;
compressing the sensor data based on the determined environmental context; and
storing the compressed data in a memory, wherein determining the environmental context comprises extracting statistical data features, geometrical data features, or statistical data features and geometrical data features, comparing the extracted data features with feature thresholds and generating context information based on the comparison between the extracted data features and the feature thresholds.

19. The method according to claim 18, comprising:
acquiring a plurality of configuration data in the plurality of environmental contexts; and
determining features of the configuration data and feature thresholds based on the environmental context using a machine learning tool.

20. The method according to claim 18, comprising:
filtering the acquired sensor data using a filter selected from a plurality of context dependent filters, the filter being selected based on the context information;
comparing the filtered data with one or more filtering thresholds;
compressing the filtered data based on the comparing of the filtered data to the one or more filtering thresholds.

21. A system, comprising:
sensing circuitry, which, in operation, generates sensor data; and
compression circuitry, coupled to the sensing circuitry, wherein the compression circuitry, in operation,
determines environmental contexts based on variation rates of sensor data; and
compresses sensor data based on determined environmental contexts, wherein the compression circuitry, in operation, extracts data features from sensor data, compares extracted data features with feature thresholds, generates context information based on the comparisons, and determines the environmental contexts based on the context information.

22. The system of claim 21, comprising an application processor, which, in operation, implements one or more of a smartphone; a smartwatch; a PDA; a portable computer; a mobile phone; a tablet; a digital audio player; a photo or video camera, a palmtop, a portable or wearable electronic apparatus; or an inertial navigation apparatus.

* * * * *

UNITED STATES PATENT AND TRADEMARK OFFICE
CERTIFICATE OF CORRECTION

PATENT NO. : 11,587,378 B2
APPLICATION NO. : 17/012495
DATED : February 21, 2023
INVENTOR(S) : Marco Castellano et al.

It is certified that error appears in the above-identified patent and that said Letters Patent is hereby corrected as shown below:

In the Claims

<u>In Column 14, Claim 14, Line 41:</u>
"according to claimer 11," should read: --according to claim 11,--.

Signed and Sealed this
Eighteenth Day of April, 2023

*Katherine Kelly Vidal*
Katherine Kelly Vidal
*Director of the United States Patent and Trademark Office*